United States Patent
Soldavini et al.

[19]

[11] Patent Number: 5,909,034
[45] Date of Patent: Jun. 1, 1999

[54] ELECTRONIC DEVICE FOR TESTING BONDING WIRE INTEGRITY

[75] Inventors: Francesco Chrappan Soldavini, Bresso; Alberto Salina, Limbiate, both of Italy

[73] Assignee: SGS-Thomson Microrlectronics S.r.l., Agrate Brianza, Italy

[21] Appl. No.: 08/648,990

[22] Filed: May 17, 1996

[30] Foreign Application Priority Data

May 19, 1995 [EP] European Pat. Off. ............ 95830214

[51] Int. Cl.⁶ .................................................. H01L 23/49
[52] U.S. Cl. ........................ 257/48; 257/773; 257/784; 257/786
[58] Field of Search .................................. 257/784, 773, 257/786, 48

[56] References Cited

U.S. PATENT DOCUMENTS

| | | | |
|---|---|---|---|
| 4,439,841 | 3/1984 | Itoh et al. | 365/51 |
| 4,467,345 | 8/1984 | Ozawa | 257/68 |
| 4,979,016 | 12/1990 | Lee | 257/666 |
| 5,101,154 | 3/1992 | Hollstein et al. | 324/158 |
| 5,477,079 | 12/1995 | Hiruta | 257/665 |

FOREIGN PATENT DOCUMENTS

| | | |
|---|---|---|
| 1-154546 | 6/1989 | Japan . |
| 4-157747 | 5/1992 | Japan . |
| 4-199673 | 7/1992 | Japan .................................. 257/784 |

OTHER PUBLICATIONS

European Search Report from European Patent Application No. 95830214.3, filed May 19, 1995.

*Primary Examiner*—David B. Hardy
*Attorney, Agent, or Firm*—Wolf, Greenfield & Sacks, P.C.

[57] ABSTRACT

A device presenting pairs of split contact pad portions, each pair of pads having multiple bonding wire, and metal connecting strips associated therewith. The end portion of the metal connecting strips being split into parallel strip segments, each connected to a respective contact pad, so as to form a plurality of parallel current paths between a node and an external contact pin connected to the node. When current is supplied along the connecting strip a voltage drop along each segment connected to a sound bonding wire is produced, but not along the segments connected to broken or non-bonded wires. By determining the existence of a voltage difference between the contact pad portions, it is possible to detect the interruption of one or more of the bonding wires.

15 Claims, 2 Drawing Sheets

ELECTRONIC DEVICE FOR TESTING BONDING WIRE INTEGRITY

BACKGROUND OF THE INVENTION

1. Field of the Invention

The present invention relates to an electronic device with multiple bonding wires, a method of fabricating such a device and a method of testing device bonding wire integrity.

2. Discussion of the Related Art

As is known, electronic power devices frequently require the use of two or more bonding wires between the pin of the device package and the die in which the device is formed when low resistivity is required and/or when the bonding wires are called upon to withstand strong current.

In the case of multiple-wire connections, a problem of checking the integrity of all the wires at the final testing stage arises. To solve this problem, the prior art has proposed splitting the contact pad to which one end of each of the bonding wires is bonded, as well as the component connected to the pad, and connecting each bonding wire to a respective portion of the split pad. Each wire is separately tested by separately turning on each component connected to it.

The above solution is shown schematically in FIGS. 1 and 2. FIG. 1 shows an electronic device 1 comprising an output stage component (here, a MOS transistor 2), one terminal of which is connected to a contact pad 3 in turn connected to a pin 4 by two wires 5. FIG. 2 shows the same device— indicated at 10—modified according to the above known solution. In this solution, component 2 is split into components 2a and 2b. The output terminals 6a and 6b are connected to respective pads 3a and 3b from which pad 3 was split. Components 2a and 2b include separate control terminals 7a and 7b for operating them independently. Pin 4 is connected by one wire 5 to pad 3a, and by the other wire 5 to pad 3b.

By turning components 2a and 2b on independently and determining if they conduct, the above solution therefore enables one to determine separately whether either wire 5 is faulty.

This solution, however, inevitably complicates the drive stage (not shown) of the device, which must be capable of turning on each component 2a and 2b separately. An additional control stage is also required for enabling the testing function of each component and selecting which output stage is to be activated. Moreover, splitting the output component and its respective pad, the need for electrically isolating the split components, and the presence of additional components for performing the test functions, considerably increase the area of the electronic device.

This drawback is further compounded when, instead of splitting a single output component, a bridge configuration is used as the output component requiring splitting of all four bridge elements.

It is an object of the present invention to provide an electronic device, a fabrication method, and a test method designed to overcome the drawbacks typically associated with the above known solutions, while at the same time ensuring reliable testing of the bonding wire integrity.

SUMMARY OF THE INVENTION

Accordingly, in one illustrative embodiment of the invention, an electronic device is provided. The electronic device includes a component, a connecting node coupled to the component, a bonding region including a plurality of contact pads, and an electrically conductive connecting line having a plurality of line portions, each line portion respectively coupling a corresponding one of the plurality of contact pads to the connecting node. The electronic device further includes an external connecting pin and a plurality of bonding wires. The plurality of bonding wires each couples a corresponding one of the plurality of contact pads to the external connecting pin, so that the plurality of bonding wires and the plurality of line portions form a plurality of parallel current paths between the external connecting pin and the connecting node.

In another illustrative embodiment of the invention, a method of fabricating an electronic device including an electronic component and an external connecting pin is provided. The method includes the steps of coupling the component to a connecting node, and coupling an electrically conductive connecting line that includes a plurality of line segments between the connecting node and a bonding region that includes a plurality of contact pads, each of the plurality of line segments coupling the connecting node to a respective one of the plurality of contact pads. The method further includes the steps of bonding each of a plurality of bonding wires between the external connecting pin and a corresponding one of the plurality of contact pads so that the plurality of bonding wires and the plurality of line segments form parallel current paths between the external connecting pin and the connecting node, and testing the integrity of the plurality of bonding wires by supplying an equal current to each parallel current path and determining whether a potential difference results between any two of the plurality of contact pads.

In another illustrative embodiment of the invention, a method of testing the integrity of a plurality of bonding wires of an electronic device is provided. The electronic device includes a component, a connecting node coupled to the component, a plurality of contact pads, an electrically conductive connecting line having a portion divided into a plurality of line segments that each couples the connecting node to one of the plurality of contact pads, an external connecting pin, and a plurality of bonding wires that each couples one of the plurality of contact pads to the external connecting pin so that the line segments and the bonding wires form a plurality of parallel current paths between the external connecting pin and the connecting node. The method of testing includes the steps of supplying a substantially equal current to at least one pair of the plurality of parallel current paths, and determining whether a potential difference results between the plurality of contact pads respectively coupled to the at least one pair of the plurality of parallel current paths.

In another illustrative embodiment of the invention, an apparatus is provided in an electronic device including an electrical component and a connecting pin. The apparatus includes first and second contact pads, first and second bonding wires that respectively couple the first and second contact pads to the connecting pin, and a node coupled to the electrical component. The apparatus also includes a conductive line including first and second line portions that respectively couple the first and second contact pads to the node, wherein the first and second line portions, contact pads and bonding wires form first and second passive parallel paths between the connecting pin and the node.

In another illustrative embodiment of the invention, an electronic device is provided which includes a connecting pin, a node, first and second parallel paths that couple the connecting pin to the node, and a comparator. The comparator is coupled to the first and second parallel paths, and detects a potential difference between the first and second parallel paths.

In another illustrative embodiment of the invention, an electronic device is provided that includes a connecting pin, a node, first and second passive parallel paths that couple the connecting pin to the node, and a detecting means. The detecting means is coupled to the first and second passive parallel paths, for detecting a fault in one of the first and second parallel paths.

In another illustrative embodiment of the invention a method of testing the integrity of a plurality of parallel conductive paths in an electronic device is provided. The plurality of parallel conductive paths include first and second parallel conductive paths. The method of testing includes the steps of supplying current to the first and second parallel conductive paths, determining whether a potential difference exists between the first and second parallel conductive paths, and identifying a fault in the plurality of parallel conductive paths when the potential difference is greater than a predetermined potential difference.

BRIEF DESCRIPTION OF THE DRAWINGS

A number of preferred, non-limiting embodiments of the present invention will be described by way of example with reference to the accompanying drawings, in which.

DETAILED DESCRIPTION

Figure 1:
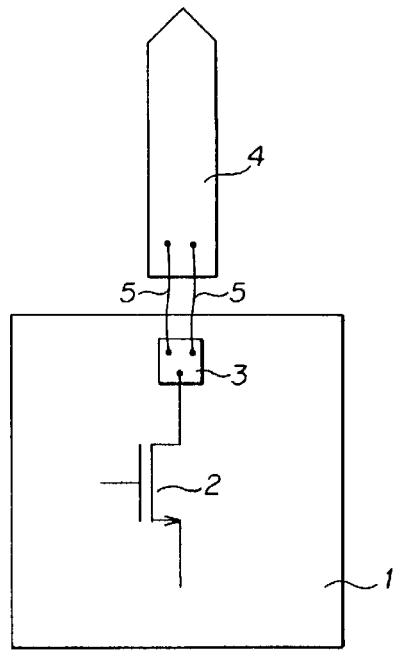
FIG. 1 shows a prior art electronic power device with a multiple bonding wire.
Figure 2:
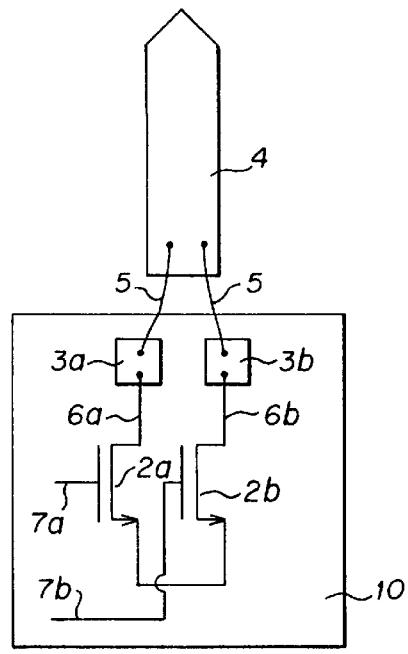
FIG. 2 shows another prior art power device.
Figure 3:
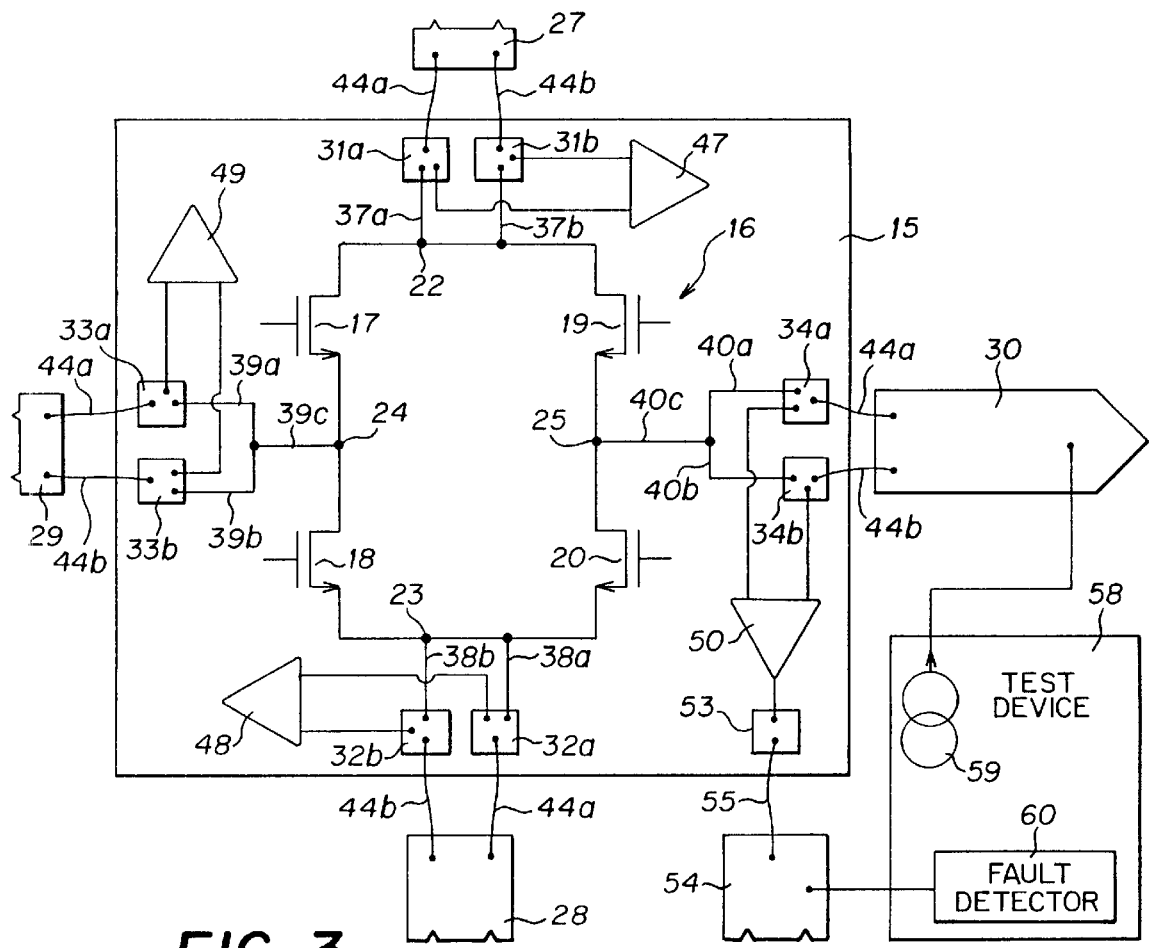
FIG. 3 shows a simplified circuit diagram of a device in accordance with the present invention.

The present invention provides for only splitting the contact pads and part of the (metal) line connecting the externally connected terminal of the components to the split pads, so as to achieve a plurality of parallel current paths between the outside terminal of the device and the contact pin. When supplied with current, therefore, the connecting line produces a voltage drop along each of its split portions connected to a sound bonding wire, but not along the split portions connected to broken or non-bonded wires; so that any interruption of one or more of the bonding wires may be detected by measuring the voltage difference between the split pads. In FIG. 3, the device 15 according to one embodiment of the present invention comprises an output bridge 16. A drive section (not shown), and other electronic components (not shown) are typically connected to the output bridge 16. In the example shown, the bridge comprises four MOS transistors 17, 18, 19 and 20 connected to form four nodes 22, 23, 24 and 25, of which, typically, nodes 22 and 23 are connected to the power supply and ground, respectively. Nodes 24 and 25 form the output of the bridge. Nodes 22–25 are all connected external to device 15 by respective pins 27–30 via two-wire connections used to ensure low resistivity and a high current carrying capacity, as indicated above.

In FIG. 3, the output pads connected to nodes 22–25 are split to form four pairs of output pads 31a, 31b, 32a, 32b, 33a, 33b, and 34a, 34b, directly coupled, i.e., through a wire, not an active component, respectively to nodes 22, 23, 24 and 25 by four pairs of connecting lines in the form of metal strips. More specifically, the connection between node 22 and output pads 31a, 31b is split and formed of metal line portions 37a, 37b; the connection between node 23 and output pads 32a, 32b is split and formed of metal line portions 38a, 38b; the connection between node 24 and output pads 33a, 33b includes a split metal line portion 39a, 39b (terminating at pads 33a, 33b) and a common metal line portion 39c (extending from node 24); and the connection between node 25 and output pads 34a, 34b includes a split portion 40a, 40b and a common portion 40c. Each output pad is connected to its respective pin by a wire 44a, 44b.

Device 15 also comprises four comparators 47–50, one for each pair of pads 31–34, each having two inputs connected to the pads in a respective pair of pads. The outputs of comparators 47–50 are connected external to device 15 as shown in FIG. 3 for comparator 50 only. For this purpose, the device includes a contact pad 53 connected to a pin 54 by a bonding wire 55.

FIG. 3 also shows the connection of a test device 58 comprising a current source 59 connected to pin 30, and a fault detecting and signaling stage 60 connected to pin 54.

Figure 4:
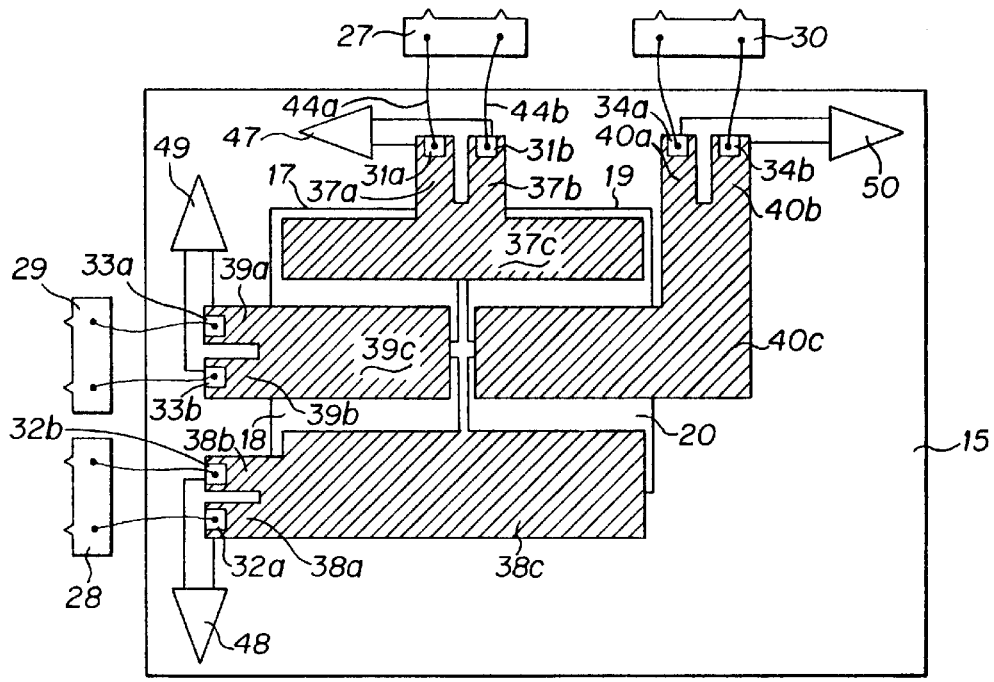
FIG. 4 is a more detailed view of connecting lines 37–40 of FIG. 3.

FIG. 4 is a more detailed view of connecting lines 37–40 of FIG. 3. FIG. 4 illustrates the actual implementation of connecting lines 37–40 in the form of metal strips indicated using the same numbering system as in FIG. 3. In FIG. 4, transistors 17–20 are shown in the form of rectangles corresponding to the area in which they are integrated; also shown are the connecting lines between transistors 17–20, formed of portions 38c, 40c for the connections to pads 32, 34, and portions 37c, 39c for the connections to pads 31, 33.

In FIGS. 3 and 4, the portions of the split metal connecting lines, for example 37a, 37b, the relative contact pads, for example 31a and 31b, and the respective bonding wires, 44a, 44b, represent pairs of passive parallel paths between the bonding region and the external pin. As used herein, the term "passive path" indicates that the path does not include any active components. When current is forced along the paths, if the bonding wires are sound and the paths balanced, the current is divided equally in half and produces substantially the same small voltage drop along both paths. Actually, the small difference generally existing in the length of the bonding wires results in a voltage difference at the pads, so that a small difference in potential exists at the inputs of the comparator (50 in FIG. 3) connected to the test connection. This difference, however, is generally below the sensitivity of the comparator. Further, the comparator may be designed with a trigger threshold higher than the small difference in potential, so that its output is zero (logic 0) when the bonding wires are intact, and a sound connection is indicated by fault detecting and signaling stage 60.

Conversely, if either one of bonding wires 44a or 44b is interrupted (e.g. wire 44a), current only flows, and produces a voltage drop, along one of the parallel paths (path 44b, 34b, 40b). In this case, pad 34b is at a different potential from pad 34a (equal to that at the junction between portions 40a, 40b, 40c). The comparator detects a voltage difference above its trigger threshold, and supplies an output voltage other than zero (logic 1 signal). The output signal is then detected by stage 60 which signals a fault.

Figure 5:
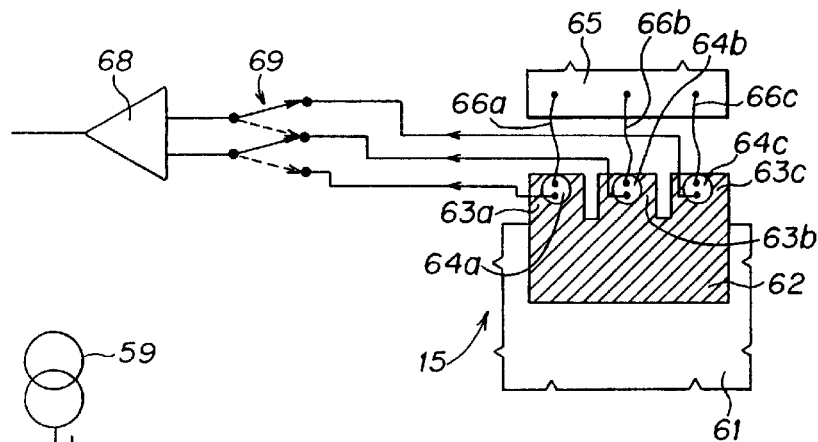
FIG. 5 is an alternative embodiment of the present invention.

FIG. 5 is another embodiment of the present invention which relates to a three-wire connection. FIG. 5 shows only part of device 15, and a component 61 connected external to device 15 by a metal connecting line 62. The end portion of the metal connecting line is divided into three parts 63a, 63b, 63c; three areas or pads 64a, 64b, 64c connect parts 63a, 63b, 63c of line 62 to a pin 65 by means of respective bonding wires 66a, 66b, 66c. Areas 64a, 64b, 64c are also connected to the inputs of a comparator 68 via a system of switches 69 (multiplexer) for selectively connecting areas 64a, 64b, 64c to comparator 68. This permits the comparator to successively measure, by changing the position of switches 69, the potential difference between areas 64a and 64b, areas 64a and 64c, and areas 64b and 64c.

Figure 6:
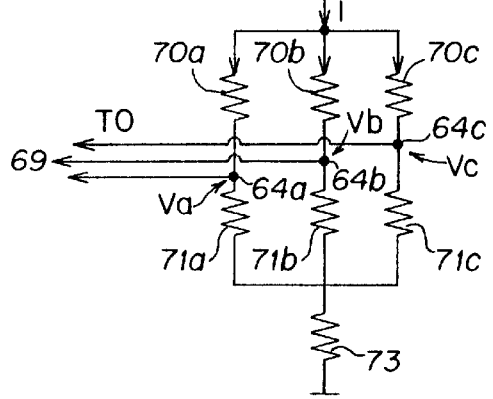
FIG. 6 is a schematic representation of the embodiment of FIG. 5.

FIG. 6 shows an electric diagram of the FIG. 5 structure, in which switch system 69 and comparator 68 are not shown. Bonding wires 66a, 66b, 66c are represented by resistors 70a, 70b, 70c, respectively; parts 63a, 63b, 63c are represented by resistors 71a, 71b, 71c, respectively, of substantially the same resistance $R_a$, $R_b$, $R_c$. The common portion of connecting line 62 and the current path through component 61 (and any other components) to ground is represented by resistor 73. FIG. 6 also shows a current source 59 for generating a current I which is divided into currents $I_a$, $I_b$, $I_c$ along the three parallel paths.

If $V_a$, $V_b$, $V_c$ are the voltages with respect to ground of areas 64a, 64b, 64c, and if:

$\Delta V_{a,b} = V_a - V_b = I_a^* R_a - I_b^* R_b$
$\Delta V_{b,c} = V_b - V_c = I_b^* R_b - I_c^* R_c$
$\Delta V_{a,c} = V_a - V_c = I_a^* R_a - I_c^* R_c$ and all the connections are sound:

$I_a = I_b = I_c$ so that:

$\Delta V_{a,b} = \Delta V_{b,c} = \Delta V_{a,c} = 0$

Conversely, if wire 66a is interrupted (broken or improperly bonded), no current flows through resistors 70a, 71a, so that:

$\Delta V_{b,c} = 0$; $\Delta V_{a,b} = \Delta V_{a,c} < 0$.

In the case, for example, of a connecting line with a sheet resistance of $R_\square = 20$ m$\Omega/\square$, a length/width L/W ratio of 0.5, and whose terminal portion is divided into parts 63a, 63b, 63c so that they present a L/W ratio of 1.5, this results in $R_a = R_b = R_c = R_\square \times L/W = 30$ m$\Omega$. If current I equals 1 A, and only wire 66a is broken, $I_a = 0$; and $I_b = I_c = 0.5$ A, so that $\Delta V_{a,b} = \Delta V_{a,c} = -15$ mV. If two wires (e.g. 66a, 66b) are broken, $I_a = I_b = 0$; and $I_c = 1$ A, so that $\Delta V_{a,c} = \Delta V_{b,c} = -30$ mV.

On the basis of the voltage difference detected, it is therefore possible to determine if, how many, and which bonding wires are interrupted.

Integrity of the bonding wires is typically checked during final testing of device 15, at the end of fabrication, by connecting device 58 and initiating the testing procedure. To externally communicate the outcome of the comparison by the comparator/s, specific pads 53 (and pins 54) may be provided, as shown in FIG. 3, or one or more of the existing pads also used for other functions may be employed. In the latter case, provisions must be made for activating the correct function for the pad by means of an appropriate input configuration (a special input specifying, instant by instant, the function to be activated), or by programming a device register (an obviously advantageous solution if the device already features memory registers for its functions, in which case, forming a specific register for memorizing and setting the desired function, or adding a dedicated bit in an existing register poses no problem). A command for enabling/disabling the test function may also be provided, as described above, by appropriately programming the inputs and/or by writing a code into one or more registers.

The advantages of the device and test method described above include the following. They provide for clearly indicating any interruption of the bonding wires with no need for duplicating or multiplying the externally connected components or their control stages. Though the solution described involves an increase in occupied area for forming split or multiple contact pads and accommodating the comparators, the increase in area due to the comparators may be reduced by providing one comparator, to the inputs of which all the pairs or groups of pads are connected selectively, in which case, however, a switching section would be required. Alternatively, the increase in area due to the comparators may be eliminated by locating them outside the device and including them in test device 58. No such increase in area is necessary in the case of devices already featuring comparators for final testing.

Clearly, changes may be made to the illustrative examples of the device and test method described and illustrated herein without departing from the scope of the present invention. For example, the comparators (in addition to being internal or external) may be formed in any known way, bearing in mind that the currents for biasing the input stages may be such as to require turnoff of some or all of the comparators to prevent excessive losses at the contact pads when the power stages (final components) are off. As stated above, provision may be made for one comparator for each pair of pads to be compared, or for a single comparator with a switching section. Moreover, an internal logic circuit may be provided for determining the output of the various comparators, and, in the event any comparator indicates a fault on any one of the bonding wires, for supplying a fault output signal.

The current source 59 may be external, as shown, or internal, and, for example, may supply current through the final components.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalent thereto.

What is claimed is:

1. An electronic device comprising:

a component;

a connecting node coupled to the component;

a bonding region including a plurality of contact pads;

an electrically conductive connecting line having a plurality of line portions, each line portion respectively coupling a corresponding one of the plurality of contact pads to the connecting node;

an external connecting pin;

a plurality of bonding wires each coupling a corresponding one of the plurality of contact pads to the external connecting pin, wherein the plurality of bonding wires and the plurality of line portions form a plurality of parallel current paths that connect the external connecting pin to the connecting node; and a potential difference detector having a pair of inputs respectively coupled to a pair of the plurality of contact pads to determine a potential difference between the pair of the plurality of contact pads, the potential difference detector generating a fault output signal when the potential difference between the pair of the plurality of contact pads is substantially different from zero.

2. The device of claim 1, wherein the connecting line comprises a metal strip having an end portion divided into the plurality of line portions, each of the plurality of line portions having substantially the same resistance.

3. The device of claim 2, wherein each of the plurality of line portions is substantially identical, and wherein the plurality of line portions includes line portions that extend substantially parallel to one another.

4. The device of claim 1, further comprising a current supply coupled to said parallel current paths to supply a substantially same current along each of said parallel current paths.

5. The device of claim 1, further comprising a switch adapted to selectively couple different pairs of the plurality of contact pads to the potential difference detector.

6. An electronic device comprising:

a component;

a connecting node coupled to the component;

a bonding region including a plurality of contact pads;

an electrically conductive connecting line having a plurality of line portions, each line portion respectively coupling a corresponding one of the plurality of contact pads to the connecting node;

an external connecting pin;

a plurality of bonding wires each coupling a corresponding one of the plurality of contact pads to the external connecting pin, wherein the plurality of bonding wires and the plurality of line portions form a plurality of parallel current paths that connect the external connecting pin to the connecting node;

a current supply coupled to said parallel current paths to supply a substantially same current along each of said parallel current paths; and a potential difference detector having a pair of inputs respectively coupled to a pair of the plurality of contact pads to determine a potential difference between the pair of the plurality of contact pads, the potential difference detector generating a fault output signal when the potential difference between the pair of the plurality of contact pads is substantially different from zero.

7. The device of claim 6, wherein the potential difference detector comprises a comparator having first and second inputs respectively coupled to the pair of the plurality of contact pads.

8. The device of claim 6, further comprising a switch adapted to selectively couple different pairs of the plurality of contact pads to the potential difference detector.

9. In an electronic device including an electrical component and a connecting pin, an apparatus comprising:

first and second contact pads;

first and second bonding wires that respectively couple the first and second contact pads to the connecting pin;

a node coupled to the electrical component;

a conductive line including first and second line portions that respectively couple the first and second contact pads to the node, wherein the first and second line portions, contact pads and bonding wires form first and second passive parallel paths that connect the connecting pin to the node; and a comparator, coupled to the first and second contact pads, that determines a potential difference between the first and second contact pads.

10. The apparatus of claim 9, further comprising:

a third contact pad; and a third bonding wire that couples the third contact pad to the connecting pin; and wherein the conductive line further includes a third line portion that couples the third contact pad to the node, the third line portion, the third contact pad and the third bonding wire forming a third passive parallel path between the connecting pin and the node.

11. The apparatus of claim 10 further comprising a switch adapted to selectively couple two of the first, second and third contact pads to the comparator.

12. The apparatus of claim 11, in combination with a current source, coupled to the connecting pin, that sources a current into the first and second passive parallel paths.

13. The combination of claim 12, in combination with a fault detector, coupled to the comparator, that signals a fault when the potential difference detected by the comparator is substantially non-zero.

14. In an electronic device including an electrical component and a connecting pin, an apparatus comprising:

first and second contact pads;

first and second bonding wires that respectively couple the first and second contact pads to the connecting pin;

a node coupled to the electrical component;

a conductive line including first and second line portions that respectively couple the first and second contact pads to the node, wherein the first and second line portions, contact pads and bonding wires form first and second passive parallel paths that connect the connecting pin to the node;

a third contact pad; and a third bonding wire that couples the third contact pad to the connecting pin; and wherein the conductive line further includes a third line portion that couples the third contact pad to the node, the third line portion, the third contact pad and the third bonding wire forming a third passive parallel path between the connecting pin and the node.

15. The apparatus of claim 14, further comprising a switch adapted to selectively couple two of the first, second and third contact pads to the comparator.

* * * * *

UNITED STATES PATENT AND TRADEMARK OFFICE
CERTIFICATE OF CORRECTION

PATENT NO. : 5,909,034
DATED : June 1, 1999
INVENTOR(S) : Francesco Chrappan Soldavini and Alberto Salina It is certified that error appears in the above-identified patent and that said Letters Patent is hereby corrected as shown below:

On the title page, directly below "United States Patent" the inventor should be identified:

Chrappan Soldavini et al.

The Assignee section should read:

[75] Assignee:     SGS-Thomson Microelectronics S.r.l.
                                  Agrate Brianza, Italy Signed and Sealed this Seventh Day of September, 1999

Attest:

Q. TODD DICKINSON

Attesting Officer     Acting Commissioner of Patents and Trademarks